US008514527B2

(12) United States Patent
Komagaki et al.

(10) Patent No.: US 8,514,527 B2
(45) Date of Patent: Aug. 20, 2013

(54) MAGNETORESISTIVE EFFECT HEAD HAVING A MULTILAYERED PINNED LAYER AND/OR FREE LAYER HAVING AMORPHOUS AND CRYSTALLINE LAYERS, AND SYSTEMS THEREOF

(75) Inventors: Kojiro Komagaki, Kanagawa (JP); Katsumi Hoshino, Kanagawa (JP); Masashige Sato, Kanagawa (JP); Hiroyuki Hoshiya, Kanagawa (JP)

(73) Assignee: HGST Netherlands B.V., Amsterdam (NL)

( * ) Notice: Subject to any disclaimer, the term of this patent is extended or adjusted under 35 U.S.C. 154(b) by 249 days.

(21) Appl. No.: 12/955,767

(22) Filed: Nov. 29, 2010

(65) Prior Publication Data
US 2011/0134563 A1 Jun. 9, 2011

(30) Foreign Application Priority Data
Dec. 8, 2009 (JP) .................................. 2009-278388

(51) Int. Cl.
*G11B 5/39* (2006.01)
(52) U.S. Cl.
USPC ............... 360/324.11; 360/324.12; 360/324.2
(58) Field of Classification Search
USPC .................. 360/324.1, 324.11, 324.12, 324.2
See application file for complete search history.

(56) References Cited

U.S. PATENT DOCUMENTS

| 2006/0056115 | A1 | 3/2006 | Djayaprawira et al. | |
|---|---|---|---|---|
| 2007/0195592 | A1 | 8/2007 | Yuasa | |
| 2008/0112093 | A1* | 5/2008 | Sato et al. ................. | 360/324.2 |
| 2008/0179699 | A1* | 7/2008 | Horng et al. ............... | 257/421 |
| 2008/0191251 | A1* | 8/2008 | Ranjan et al. ............. | 257/295 |
| 2008/0217710 | A1* | 9/2008 | Horng et al. ............... | 257/421 |
| 2009/0155629 | A1* | 6/2009 | Gill .......................... | 428/828.1 |
| 2010/0009467 | A1* | 1/2010 | Horng et al. ............... | 438/3 |

(Continued)

FOREIGN PATENT DOCUMENTS

| JP | 2001-068760 | 3/2001 |
|---|---|---|
| JP | 2004-071714 | 3/2004 |

(Continued)

OTHER PUBLICATIONS

Hayakawa et al., "Dependence, of Giant Tunnel Magnetoresistance of Sputtered CoFeB/MgO/CoFeB Magnetic Tunnel Junctions on MgO Barrier Thickness and Annealing Temperature," Japanese Journal of Applied Pnysics, vol. 44, No. 19, 2005, p. L587-L589.

(Continued)

*Primary Examiner* — Jefferson Evans
(74) *Attorney, Agent, or Firm* — Zilka-Kotab, PC

(57) ABSTRACT

According to one embodiment, a magnetoresistive effect head includes a magnetically pinned layer having a direction of magnetization that is pinned, a free magnetic layer positioned above the magnetically pinned layer, the free magnetic layer having a direction of magnetization that is free to vary, and a barrier layer comprising an insulator positioned between the magnetically pinned layer and the free magnetic layer, wherein at least one of the magnetically pinned layer and the free magnetic layer has a layered structure, the layered structure including a crystal layer comprising one of: a CoFe magnetic layer or a CoFeB magnetic layer and an amorphous magnetic layer comprising CoFeB and an element selected from: Ta, Hf, Zr, and Nb, wherein the crystal layer is positioned closer to a tunnel barrier layer than the amorphous magnetic layer. In another embodiment, a magnetic data storage system includes the magnetoresistive effect head described above.

19 Claims, 3 Drawing Sheets

(56) References Cited

U.S. PATENT DOCUMENTS

| | | | |
|---|---|---|---|
| 2011/0164448 A1* | 7/2011 | Sato et al. | 365/158 |
| 2011/0303997 A1* | 12/2011 | Wang et al. | 257/421 |
| 2012/0018823 A1* | 1/2012 | Huai et al. | 257/421 |
| 2012/0148735 A1* | 6/2012 | Zhou | 427/129 |

FOREIGN PATENT DOCUMENTS

| | | |
|---|---|---|
| JP | 2006-080116 A | 3/2006 |
| JP | 2006-134950 | 5/2006 |
| JP | 04082711 B2 | 4/2008 |
| JP | 2008-198792 | 8/2008 |
| JP | 2008-277388 | 9/2008 |
| JP | 2009-004784 | 1/2009 |

OTHER PUBLICATIONS

Matsumoto, "Flow In Studies Of Amorphous Metallic Materials," The Research Institute for Electric and Magnetic Materials, Sendai, Mar. 26, 1998, 8 pgs., no translation.

* cited by examiner

MAGNETORESISTIVE EFFECT HEAD HAVING A MULTILAYERED PINNED LAYER AND/OR FREE LAYER HAVING AMORPHOUS AND CRYSTALLINE LAYERS, AND SYSTEMS THEREOF

RELATED APPLICATIONS

The present application claims priority to a Japanese Patent Application filed Dec. 8, 2009 under Appl. No. 2009-278388, which is incorporated herein by reference.

FIELD OF THE INVENTION

The present invention relates to a magnetoresistive effect head and a magnetic data storage system having the magnetoresistive effect head.

BACKGROUND OF THE INVENTION

Typically, a magnetic head used in a magnetic disk drive is provided with a playback head for reading information recorded on a recording medium. In the playback head, a magnetoresistive effect film changes resistance in response to a magnetization signal recorded on the recording medium.

The magnetoresistive effect film is typically provided with a magnetically pinned layer for pinning a direction of magnetization in one direction and a free magnetic layer which freely changes a direction of magnetization depending on a signal magnetic field from the medium, and detects the change in the magnetoresistance produced by changing the relative angle of the respective directions of magnetization of the free magnetic layer and the magnetically pinned layer by the action of the magnetization signal of the medium, and also reads the signal. Consequently, in order to improve the reading performance of the playback head, a magnetoresistive effect film exhibiting a large change in the magnetoresistive effect and a magnetoresistive effect element provided with the film are very useful.

SUMMARY OF THE INVENTION

According to one embodiment, a magnetoresistive effect head includes a magnetically pinned layer having a direction of magnetization that is pinned, a free magnetic layer positioned above the magnetically pinned layer, the free magnetic layer having a direction of magnetization that is free to vary, and a barrier layer comprising an insulator positioned between the magnetically pinned layer and the free magnetic layer, wherein at least one of the magnetically pinned layer and the free magnetic layer has a layered structure, the layered structure including a crystal layer comprising one of: a CoFe magnetic layer or a CoFeB magnetic layer and an amorphous magnetic layer comprising CoFeB and an element selected from a group consisting of: Ta, Hf, Zr, and Nb, wherein the crystal layer is positioned closer to a tunnel barrier layer than the amorphous magnetic layer.

In another embodiment, a magnetic data storage system includes the magnetoresistive effect head described above, a magnetic medium, a drive mechanism for passing the magnetic medium over the at least one magnetoresistive effect head, and a controller electrically coupled to the at least one magnetoresistive effect head for controlling operation of the at least one magnetoresistive effect head.

Any of these embodiments may be implemented in a magnetic data storage system such as a disk drive system, which may include a magnetic head, a drive mechanism for passing a magnetic storage medium (e.g., hard disk) over the head, and a control unit electrically coupled to the head for controlling operation of the head.

Other aspects and advantages of the present invention will become apparent from the following detailed description, which, when taken in conjunction with the drawings, illustrate by way of example the principles of the invention.

DETAILED DESCRIPTION

Figure 1:
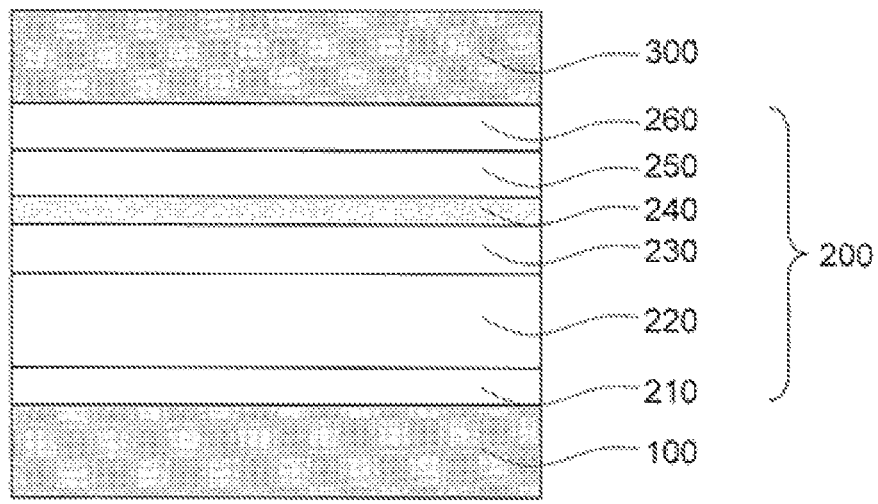
FIG. 1 is a lateral cross-sectional view showing an example of a film structure of a conventional magnetoresistive effect element.

The following description is made for the purpose of illustrating the general principles of the present invention and is not meant to limit the inventive concepts claimed herein. Further, particular features described herein may be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

One film structure that may be used for the magnetoresistive effect element includes a structure having a tunnel barrier layer formed by placing an insulator between the magnetically pinned layer and the free magnetic layer. In U.S. Pat. No. 4,082,711, a magnetoresistive effect element which uses MgO as the tunnel barrier layer and exhibits an extremely large magnetoresistance change ratio (TMR ratio) is described below.

In Japanese Unexamined Patent Appl. Pub. No. 2006-80116, a CoFeB/MgO/CoFeB-tunnel magnetoresistive element which uses a CoFeB magnetic layer and a MgO barrier layer, which were formed by a sputtering method widely used in industry, and exhibits a high TMR ratio exceeding 200% is described below.

In J. Hayakawa et al., Jpn. J. Appl. Phys., 44, L587 (2005), one reason for the appearance of a high TMR ratio in the CoFeB/MgO/CoFeB-tunnel magnetoresistive element is investigated. According to this reference, the reason for obtaining a high TMR ratio is believed to be that when the CoFeB layer, which is non-crystalline (amorphous), is subjected to thermal processing immediately after film deposition, (001) oriented crystals occur along the tunnel barrier layer which has (001) oriented crystals.

From these references, it may be ascertained that in order for the TMR element applicable to a playback head to obtain a high TMR, namely, a high playback output, the use of an insulation layer having (001) oriented crystallinity as the tunnel barrier layer, and the use of CoFeB layers in the magnetically pinned layer and the free magnetic layer are believed to be very effective.

Over the past few years, the bit widths on recording media have narrowed further and further, accompanying the higher recording density requirements of modern hard disk drives. Therefore, in order to read the magnetic signal recorded on the recording medium, the reading resolution must be improved by narrowing the read gap of the playback head. The read gap corresponds to the film thickness of the magnetoresistive effect film.

In order to thin the magnetoresistive effect film, it is effective to thin the film thickness of at least one of the CoFeB layer forming the magnetically pinned layer or the CoFeB layer forming the free magnetic layer which comprise most of the magnetoresistive effect film.

However, when the CoFeB layer is thin, the TMR ratio degrades substantially, in most heads. This is believed to be the result of the obstruction of the crystallization of the CoFeB layer along the atom arrangement of the tunnel barrier layer because of the epitaxial relationship originating in the compatibility of the nonmagnetic coupling layer or the antiferromagnetic layer adjacent to the magnetically pinned layer in the thermal processing executed after the magnetoresistive effect film is formed. The free magnetic layer is believed to be similarly connected to the epitaxial relationship due to the compatibility of the atom arrangement of the adjacent capping layer.

One objective of the embodiments disclosed herein is to solve the above-described problems to provide a magnetoresistive effect head capable of suppressing degradation of the MR ratio caused by thinning of the film thickness of the magnetically pinned layer and/or the free magnetic layer.

According to one general embodiment, a magnetoresistive effect head includes a magnetically pinned layer having a direction of magnetization that is pinned, a free magnetic layer positioned above the magnetically pinned layer, the free magnetic layer having a direction of magnetization that is free to vary, and a barrier layer comprising an insulator positioned between the magnetically pinned layer and the free magnetic layer, wherein at least one of the magnetically pinned layer and the free magnetic layer has a layered structure, the layered structure including a crystal layer comprising one of: a CoFe magnetic layer or a CoFeB magnetic layer and an amorphous magnetic layer comprising CoFeB and an element selected from a group consisting of: Ta, Hf, Zr, and Nb, wherein the crystal layer is positioned closer to a tunnel barrier layer than the amorphous magnetic layer.

In another general embodiment, a magnetic data storage system includes the magnetoresistive effect head described above, a magnetic medium, a drive mechanism for passing the magnetic medium over the at least one magnetoresistive effect head, and a controller electrically coupled to the at least one magnetoresistive effect head for controlling operation of the at least one magnetoresistive effect head.

In a magnetoresistive effect head according to one embodiment, at least one of the magnetically pinned layer and the free magnetic layer has an amorphous magnetic layer on the side opposite the barrier layer. The amorphous magnetic layer maintains the non-crystalline state after passing through the magnetization thermal process of the antiferromagnetic layer and the crystallization thermal process of the insulation film and the magnetic film, which are generally conducted in the manufacturing process of the magnetoresistive effect head.

In a magnetoresistive effect head according to one embodiment, the epitaxial relationship from the amorphous magnetic layer side in the CoFeB magnetic layer is lost due to the non-crystalline nature of the amorphous magnetic layer. Thus, even when the film thickness of the CoFeB layer of at least one of the magnetically pinned layer or the free magnetic layer is thinned, the effect of the crystallinity from the side opposite the barrier layer side of the CoFeB magnetic layer is reduced, and the crystallization occurs along the atom arrangement on the barrier layer side. Consequently, even if the CoFeB magnetic layer is thinner, the degradation of the MR ratio may be suppressed, and a magnetoresistive effect head which achieves both a thinner magnetoresistive effect film and a high MR ratio may be constructed.

One embodiment for is described in detail with reference to the figures. In the description below, the figures illustrate representative examples and do not limit the scope of the present invention. The figures illustrate a bottom spin valve structure, but the present invention may be applied to a top spin valve structure and/or a dual valve structure.

FIG. 1 is a lateral cross-sectional view showing an example of the film structure of a conventional magnetoresistive effect element. The example shown here is a film structure of a bottom tunnel magnetoresistive effect element.

A current-in-plane (CIP) element in which current flows in the plane of the magnetoresistive effect film and a current-perpendicular-to-the-plane (CPP) element in which the flow is in the direction perpendicular to the film plane are magnetoresistive effect elements.

The magnetoresistive effect element shown in FIG. 1 has a tunnel magnetoresistive effect film 200 between a lower shield layer 100 and an upper shield layer 300. The tunnel magnetoresistive effect film 200 has a lower ground layer 210, an antiferromagnetic layer 220, a magnetically pinned layer 230, a tunnel barrier layer 240, a free magnetic layer 250, and a capping layer 260. The read gap corresponds to the sum of the film thickness from the lower ground layer 210 to the capping layer 260.

In the film structure shown in FIG. 1, the antiferromagnetic layer 220 is positioned on the side opposite to the tunnel barrier layer 240 of the magnetically pinned layer 230. The capping layer 260 is positioned on the side opposite to the tunnel barrier layer 240 of the free magnetic layer 250.

From the epitaxial relationship of the antiferromagnetic layer 220 and the capping layer 260, the CoFeB layer of the magnetically pinned layer 230 or the free magnetic layer 250 is believed to obstruct the development of the (001) oriented crystals along the atom arrangement of the tunnel barrier layer 240.

Figure 2:
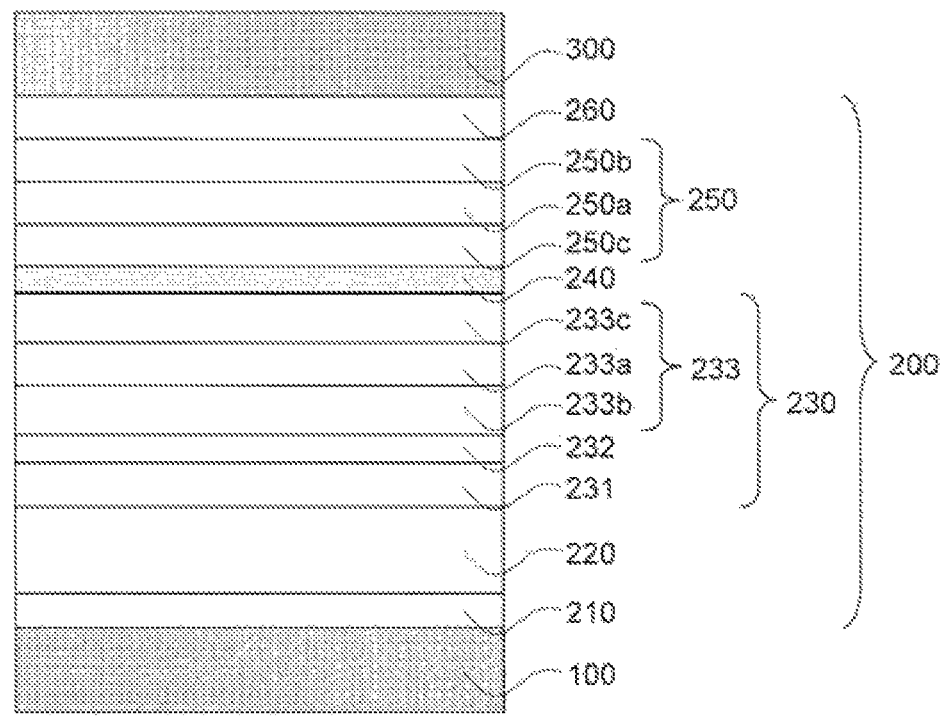
FIG. 2 is a lateral cross-sectional view showing a film structure of a magnetoresistive effect element according to one embodiment.

According to one embodiment, and referring to FIG. 2, a lateral cross-sectional view of a magnetoresistive effect element is shown. For example, the lower shield layer 100 may be comprised of permalloy formed by a plating method.

The lower ground layer 210 above the lower shield layer 100 may become the layered structure of Ta and Ru from the lower shield layer 100 side (not shown), in one approach. Also, the antiferromagnetic layer 220 above the lower ground layer 210 is shown. The antiferromagnetic layer 220 fixes the direction of magnetization of the first magnetically pinned layer 230 above the antiferromagnetic layer in one direction, and may comprise, for example, MnIr. The antiferromagnetic layer 220 may be constructed from MnPt, PdPtMn, NiMn, FeMn, RhMn, RuMn, RuRhMn, etc.

The magnetically pinned layer 230 above the anti ferromagnetic layer 220 may become a layered ferri structure, in, one approach. Specifically, the magnetically pinned layer 230 may be comprised of a three-layer structure of first magnetically pinned layer 231/nonmagnetic coupling layer 232/second magnetically pinned layer 233. The antiferromagnetic coupling is realized through the nonmagnetic coupling layer 232 between the first magnetically pinned layer 231 and the second magnetically pinned layer 233.

The first magnetically pinned layer 231 may comprise an alloy material having, for example, Co and Fe. The nonmagnetic coupling layer 232 may comprise an alloy having one or two or more of, for example, Ru, Cr, Ir, Rh, etc.

In one approach, the second magnetically pinned layer 233 may comprise a layered structure having the three layers: a CoFe magnetic layer 233c, a CoFeB magnetic layer 233a, and an amorphous magnetic layer 233b in order from the side in contact with the tunnel barrier layer 240. The amorphous magnetic layer 233b may be a layer which includes CoFeB and an element selected from the group composed of Ta, Hf, Zr, Nb.

The composition ratio of Co and Fe of the CoFe magnetic layer 233c may have a preferred composition range for Co:Fe of 75:25 to 100:0 in a face-centered cubic structure or a hexagonal close packed structure, in one embodiment. In addition, the film thickness of the CoFe magnetic layer 233c may preferably be about 0.5 nm to about 1.4 nm from the perspective of the TMR ratio, in one approach.

Preferably, the composition ratio of Co and Fe in the CoFeB magnetic layer 233a is a composition range of 100:0 to 75:25 which has the face centered cubic structure, or a composition range of 75:25 to 0:100 which has the body centered cubic structure after crystallization, in some approaches. In particular, the composition range of 75:25 to 0:100 which has the body centered cubic structure may be preferred.

Preferably, a film thickness of the amorphous magnetic layer 233b is about 0.25 nm to about 1.5 nm, in one embodiment.

The tunnel barrier layer 240 comprising an insulator is above the magnetically pinned layer 230. The material forming the tunnel barrier layer 240 may be an insulation material such as oxides, nitrides, comprising one or two or more of, for example, Mg, Ca, Zn, Sr, Al, Ti, etc., according to various embodiments.

The tunnel barrier layer 240 may obtain an optimum effect when an insulator having the (001) oriented crystallinity of a halite structure is used, in one approach. This kind of tunnel barrier layer 240 may be obtained by oxidizing or nitriding a metal film formed by a sputtering method or a vapor deposition method. Alternatively, the layer may be formed by using an oxide or a nitride target, according to various embodiments.

The free magnetic layer 250 above the tunnel barrier layer 240 may have a layered structure comprising the three layers of: a CoFe magnetic layer 250c, a CoFeB magnetic layer 250a, an amorphous magnetic layer 250b in order from the tunnel barrier layer 240 side, in one embodiment. The amorphous magnetic layer 250b is a layer comprising CoFeB and an element selected from a group consisting of: Ta, Hf, Zr, Nb, in one approach.

Preferably, a composition ratio of Co and Fe of the CoFeB magnetic layer 250a has a composition range of 100:0 to 75:25 which has a face centered cubic structure or a composition range of 75:25 to 0:100 which has a body centered cubic structure after crystallization, according to various embodiments. In particular, a composition ratio within the range of 100:0 to 90:10 which has a face centered cubic structure may be preferred in one approach. In addition, preferably, a film thickness of the CoFe magnetic layer 250c may be about 0.5 nm to about 1.0 nm from the perspective of the TMR ratio, in one approach.

The free magnetic layer 250 may include, for example, a NiFe layer on the amorphous magnetic layer 250b (not shown) because magnetostriction may be preferably minimized.

The capping layer 260 above the topmost part of the tunnel magnetoresistive effect film 200 may comprise a layered structure of, for example, Ru and Ta, in one approach.

Figure 3:
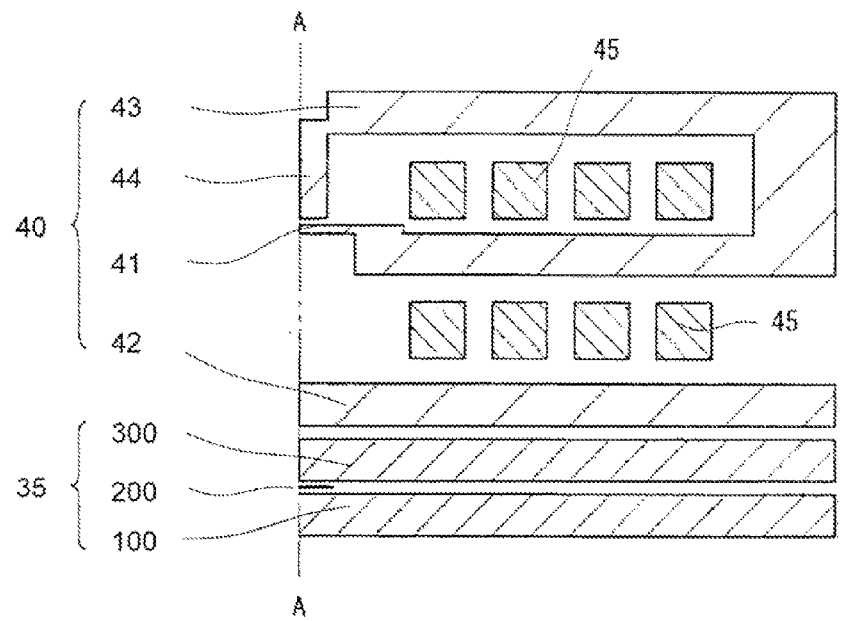
FIG. 3 is a structural diagram of a magnetic head provided with a tunnel magnetoresistive effect film according to one embodiment.

FIG. 3 is a structural diagram of a magnetic head provided with a tunnel magnetoresistive effect film, according to one embodiment. The view is the cross-sectional view in the plane direction perpendicular to the ABS plane (A-A line position).

The magnetic head has a playback head 35 and a recording head 40. The playback head 35 provides a magnetoresistive effect film 200 which is formed between the lower shield layer 100 and the upper shield layer 300.

The recording head 40 provides a main magnetic pole 41, a first return yoke 42, and a second return yoke 43. A trailing shield 44 is provided on the front end of the second return yoke 43. A coil 45 is wound around the back yoke member of the main magnetic pole 41.

The structures of the magnetoresistive effect film and the magnetic head were described above, according to various embodiments. An example of an amorphous magnetic layer placed in both the magnetically pinned layer 230 and the free magnetic layer 250 was described previously, but even if an amorphous magnetic layer is placed only on either of the layers, the effect corresponding to that part may be obtained, according to various embodiments.

As above, in the magnetoresistive effect film previously described, the second magnetically pinned layer 233 and the free magnetic layer 250 have layered structures comprising CoFe magnetic layer/CoFeB magnetic layer/amorphous magnetic layer in order from the tunnel barrier layer 240 side. It is believed that the epitaxial relationship from the amorphous magnetic layer side in the CoFeB magnetic layer is eliminated by the non-crystalline nature of the amorphous magnetic layer. Therefore, the CoFeB layer of the magnetically pinned layer 230 or the free magnetic layer 250 easily becomes (001) oriented crystals along the atom arrangement of the tunnel barrier layer 240, in one approach. Therefore, even if film thicknesses of the CoFeB magnetic layers of the magnetically pinned layer 230 and the free magnetic layer 250 are thinned, the degradation of the TMR ratio may be suppressed.

In addition, based on the magnetic head previously described, the degradation in the TMR ratio may be suppressed, and a high playback output may be obtained while continuing to narrow the read gap and improve the reading resolution by thinning the film thickness of the CoFeB magnetic layer.

Figure 4:
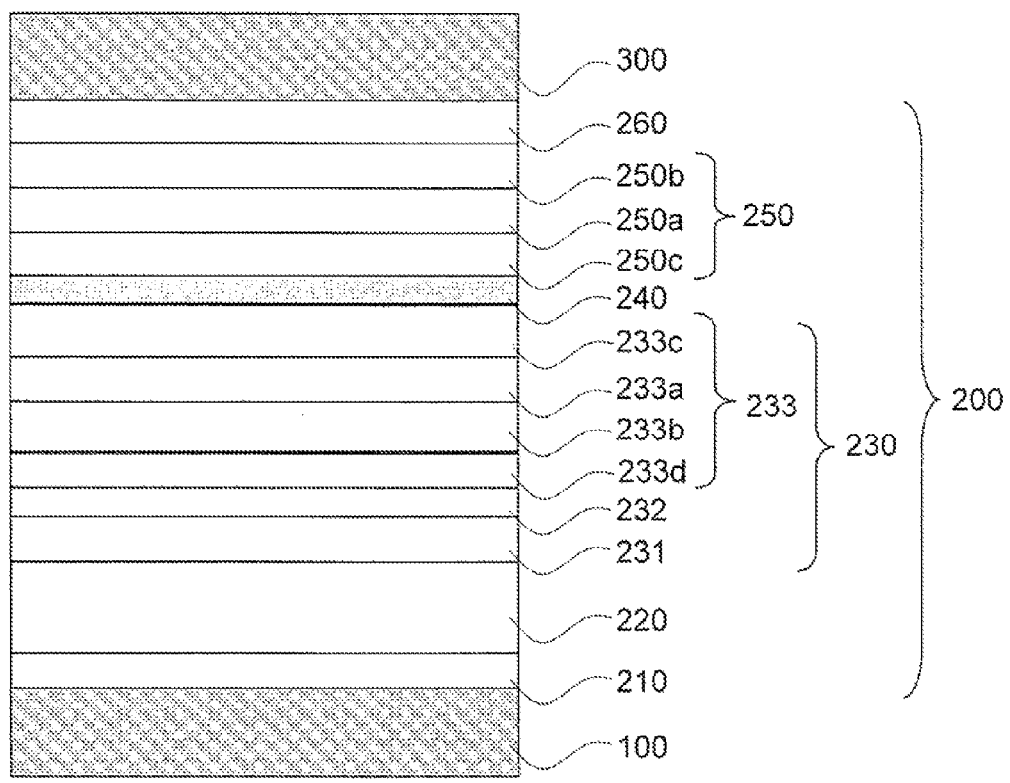
FIG. 4 is a lateral cross-sectional view showing a film structure of a magnetoresistive effect element according to one embodiment.

FIG. 4 is a lateral cross-sectional view showing a film structure of a magnetoresistive effect element, according to one embodiment. The film structure shown in FIG. 4 includes a CoFe layer 223d between the nonmagnetic coupling layer 232 and the amorphous magnetic layer 233b added to the structure described in FIG. 2. For example, the film thickness of the CoFe layer 223d may be about 0.5 nm to about 1.0 nm, according to various embodiments.

Figure 5:
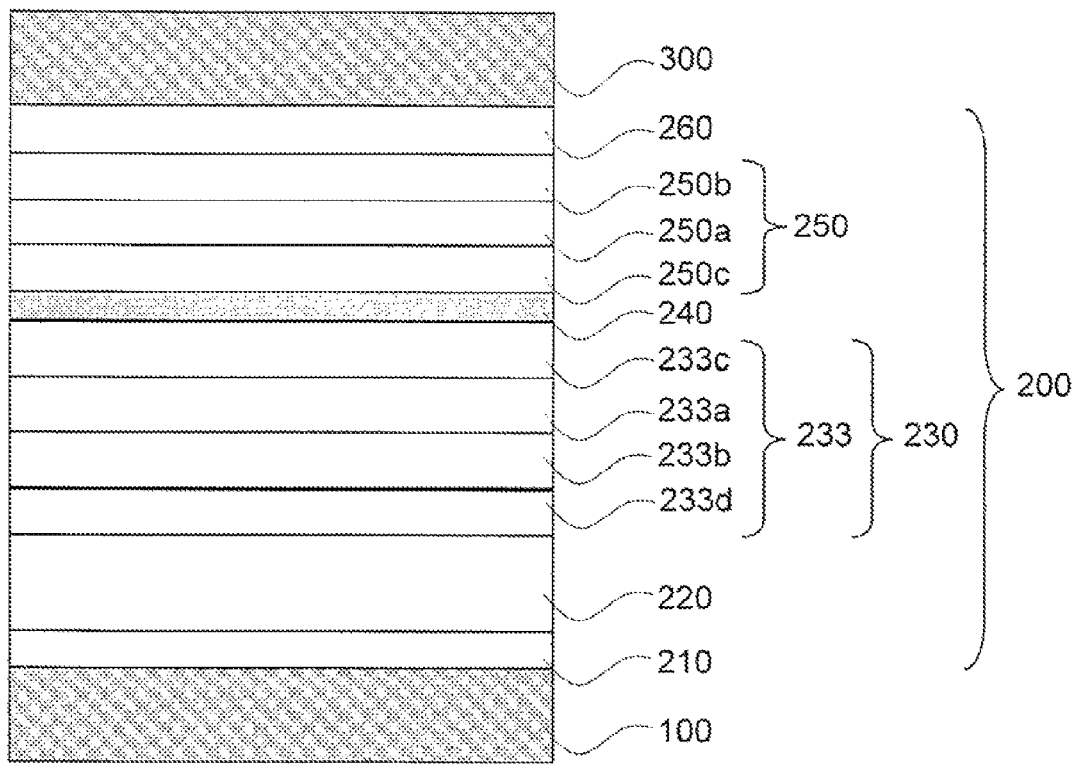
FIG. 5 is a lateral cross-sectional view showing a film structure of a magnetoresistive effect element according to one embodiment.

FIG. 5 is a lateral cross-sectional view showing a film structure of a magnetoresistive effect element, according to one embodiment. The film structure shown in FIG. 5 differs from that in FIG. 4 in that the magnetically pinned layer 230 comprises only the second magnetically pinned layer 233. The rest of the structure is the same as in FIG. 4, according to various embodiments.

In the structure of this tunnel magnetoresistive effect film, the magnetically pinned layer 230 is formed by only the second magnetically pinned layer 233. In other words, this has a single-pin structure. In the single-pin magnetoresistive effect film, a unidirectional anisotropic magnetic field Hp acting between the antiferromagnetic layer 220 and the second magnetically pinned layer 233 is directly reflected in the resistance to external magnetic fields of the magnetically pinned layer 230.

Hp is represented by the following equation (Equation 1) in terms of the unidirectional anisotropic constant Jk, the amount of saturated magnetization Ms, and the film thickness t of the second magnetically pinned layer 233.

$$Hp = Jk/(Ms \cdot t) \quad \text{Equation 1}$$

According to Equation 1 described above, it is clear that Hp increases as (Ms·t) decreases, and the second magnetically pinned layer 233 is firmly pinned.

In another embodiment, the magnetically pinned layer 230 may have a layered structure comprising the CoFe magnetic layer 233c, the CoFeB magnetic layer 233a, and the amorphous magnetic layer 233b in order from the side in contact with the tunnel barrier layer 240, according to one embodiment. The amorphous magnetic layer 233b has a small Ms compared to the CoFeB magnetic layer 233a. The (Ms·t) of the magnetically pinned layer 230 becomes smaller. Consequently, Hp is large compared to the conventional single-pin magnetoresistive effect film, which does not use the amorphous magnetic layer 233b, and the resistance to external magnetic fields of the magnetically pinned layer 230 improves.

As described above, according to one embodiment, the magnetically pinned layer 230 may have the layered structure of the CoFe magnetic layer 233c, the CoFeB magnetic layer 233a, and the amorphous magnetic layer 233b in order from the tunnel barrier layer 240 side, and obtains effects similar to the other embodiments.

In the above-described embodiments, the thermal processing is applied after the tunnel magnetoresistive effect film was formed. For example, the thermal processing is applied from several tens of minutes to several hours at a temperature from about 240° C. to about 350° C. in the magnetic field of several KOe to several tens of KOe applied in a constant direction.

Figure 6:
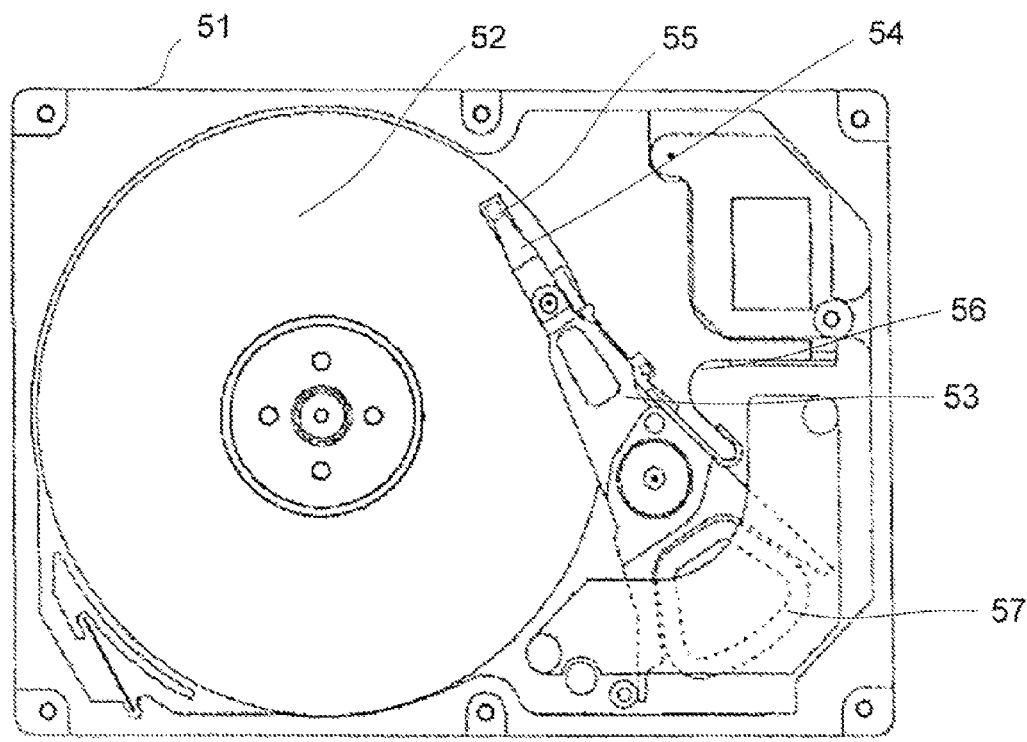
FIG. 6 is a top view of a magnetic recording and playback device according to one embodiment.

FIG. 6 shows a top view of a magnetic recording and playback device 50 according to another embodiment. The magnetic recording and playback device 50 provides a magnetic head having the structure of the magnetoresistive effect film 200 described in any one of the previous embodiments.

In one embodiment, a magnetic data storage system 50 includes at least one magnetoresistive effect head as described herein according to various embodiment, a magnetic medium 52, a drive mechanism for passing the magnetic medium over the at least one magnetoresistive effect head and a controller electrically coupled to the at least one magnetoresistive effect head for controlling operation of the at least one magnetoresistive effect head.

The magnetic recording and playback device 50 provides a plurality of magnetic recording media 52 rotatably driven by a spindle motor in a casing 51 formed in a rectangular box shape. An actuator arm 53 supported to enable swinging parallel to the medium surface is positioned on the side of the magnetic recording media 52. A suspension 54 is mounted on the front end of the actuator arm 53 in the extension direction of the actuator arm 53. A head slider 55 is mounted on the front end of the suspension 54 towards the medium surface.

The magnetic head formed from the playback head 35 provided with the magnetoresistive effect film 200 described above is formed on a head slider 55.

The magnetic head is connected to a control circuit through wires formed on the suspension 54 and a flexible cable 56 installed on the actuator arm 53. The control circuit records signals on the magnetic recording medium 52 and plays'back signals recorded on the magnetic recording medium 52.

A process which records information on the magnetic recording medium 52 and plays back the information by the magnetic head acts with the operation (seek operation) which swings the actuator arm 53 to the specified position by using the actuator 57.

Working examples according to various embodiments and according to conventional art are described below.

In Working Example 1, an example which verifies the amorphous nature of the amorphous magnetic layer which constructs the tunnel magnetoresistive effect film is explained. In Working Example 1, CoFeBTa was adopted as the structure of the amorphous magnetic layer, and the amorphous nature before and after the thermal processing was examined experimentally. The film structure of the samples used in Working Example 1 is shown below. The left side corresponds to the substrate side (lower side in FIG. 1, etc.), and the film thickness of each layer is enclosed in the parentheses ( ).

In the layered structure of Ta (3 nm)/Ru (2 nm)/Mn75Ir25 (6 nm)/Ru (0.8 nm)/(Co40Fe40B20)$_{100-x}$Ta$_x$ (10 nm)/Ta (3 nm), the x in (Co40Fe40B20)$_{100-x}$Ta$_x$ which comprises the amorphous magnetic layer indicates the composition ratio as an atomic percentage (at. %). The (Co40Fe40B20) in the parentheses indicates that Co, Fe, and B have the composition ratio of 40:40:20. The composition ratio of (Co40Fe40B20) and Ta was converted from each film growth rate. The Ta composition x was changed to 3, 6, 9, 13, 17 at. %.

To identify the amorphous nature of the fabricated samples, a vibrating sample magnetometer (VSM) and an X-ray diffraction device (XRD) were used immediately after depositing the film to measure the saturated magnetization per unit area and the diffraction peaks after thermal processing at 280° C. and thermal processing at 320° C.

When the CoFeB magnetic layer is crystallized by thermal processing, the amount of magnetization of the CoFeB magnetic layer increases under the influence of the diffusion of B. Consequently, by verifying that the saturated magnetization does not change before and after the thermal processing of the CoFeBTa amorphous magnetic layer, the amorphous nature of the amorphous magnetic layer may be identified. In addition, the amorphous nature may be identified when the diffraction peaks by X-rays cannot be observed. In the two methods described above, the amorphous nature of the CoFeBTa amorphous magnetic layer was identified. Table 1 shows the effects. The T in the table represents Tesla.

TABLE 1

| Ta (at. %) | Saturated magnetization immediately after film deposition | Saturated magnetization after thermal processing at 280° C. | Saturated magnetization after thermal processing at 320° C. | Presence of diffraction peak after thermal processing at 320° C. |
|---|---|---|---|---|
| 3 | 1.264T | 1.270T | 1.272T | No |
| 6 | 0.991T | 1.00T | 1.00T | No |
| 9 | 0.758T | — | — | No |

TABLE 1-continued

| Ta (at. %) | Saturated magnetization immediately after film deposition | Saturated magnetization after thermal processing at 280° C. | Saturated magnetization after thermal processing at 320° C. | Presence of diffraction peak after thermal processing at 320° C. |
|---|---|---|---|---|
| 13 | 0.300T | — | — | No |
| 17 | 0.032T | — | — | No |

As shown in Table 1, diffraction peaks could not be observed in any of the samples from the Ta composition of 3 at. % to 17 at. %. In addition, in the samples having the Ta compositions of 3 at. % and 6 at. %, the amount of change of the saturated magnetization after the 280° C. thermal processing and 320° C. thermal processing immediately after film deposition was less than 1%.

In other words, the CoFeBTa magnetic layer exhibits a good amorphous nature after at least thermal processing at 320° C. in the Ta composition range from 3 at. % to 17 at. %.

Bulletin of the Japan Institute of Metals Materia, Vol. 37, No. 5, p. 339 (1998) describes an amorphous magnetic layer which exists stably as an amorphous alloy when the atomic radius ratio of the elements forming the alloy is at least 12%. Consequently, even if, for example, Hf, Zr, Nb, etc., are used instead of Ta shown in Working Example 1, it is easy to assume that similar effects result.

In Working Example 2, Sample 1 described below was created as a conventional tunnel magnetoresistive effect film.

Each layer was deposited as a film by using DC magnetron sputtering. The MgO of the tunnel barrier layer was formed by first accumulating a metal Mg film by a sputtering method, and then causing natural oxidation in a chamber having a mixture ratio of oxygen and argon set to 5:95 and a chamber gas pressure of 0.1 mTorr. The oxidation time was set to 10 seconds. The metal Mg film formed a tunnel barrier layer having different thicknesses in the substrate by film deposition at an incline with respect to the substrate so that different area resistances (RA) were obtained. After each layer was deposited, thermal processing was conducted at 50 kOe, 280° C. for 3 hours in a thermal processing reactor in a magnetic field.

Sample 1 described below roughly corresponds to the removal of the amorphous magnetic layers 233b and 250b in FIG. 4. "Ta (1 nm)/Ru (2 nm)" on the left side of Sample 1 corresponds to the lower ground layer 210 and corresponds to the layer one step higher when advancing to the right. "MgO (0.8 nm)" corresponds to the tunnel barrier layer 240. The right side of the tunnel barrier layer 240 corresponds to the free magnetic layer 250.

Sample 1 included: Si/Ta (1 nm)/Ru (2 nm)/Mn75Ir25 (5 nm)/Co75Fe25 (2 nm)/Ru (0.8 nm)/Co90Fe10 (0.5 nm)/Co40Fe40B20 (2 nm)/Co90Fe10 (1.4 nm)/MgO (0.8 nm)/Co90Fe10 (0.9 nm)/Co40Fe40B20 (3 nm)/Ru (3 nm)/Ta (3 nm)/Ru (4 nm)

A sample similar to Sample 1 was fabricated except the film thickness of the CoFeB magnetic layer 233a (Co40Fe40B20 (2 nm)) was set to 1 nm, denoted as Sample 2.

A sample similar to Sample 1 was fabricated except the film thickness of the CoFeB magnetic layer 250a (Co40Fe40B20 (3 nm)) was set to 2 nm, denoted as Sample 3.

Table 2 shows the results where the value of the TMR ratio was measured for each sample when the RA value was fixed. The measurement method was the current-in-plane tunneling (CIPT) method.

TABLE 2

| Sample No. | CoFeB film thickness of 2nd magnetically pinned layer | Film thickness of 2nd magnetically pinned layer | CoFeB film thickness of free magnetic layer | CoFeB film thickness of free magnetic layer | TMR ratio |
|---|---|---|---|---|---|
| 1 | 2 nm | 3.9 | 3 nm | 3.9 | 80.5 |
| 2 | 1 nm | 2.9 | 3 nm | 3.9 | 40.4 |
| 3 | 2 nm | 3.9 | 2 nm | 2.9 | 72.1 |

As shown in Table 2, compared to Sample 1, the TMR ratio decreased in Sample 2 and Sample 3. From the above results, in the conventional example, it is understood that when the film thickness of the CoFeB magnetic layer of at least one of the magnetically pinned layer and the free magnetic layer is thinned, the TMR ratio degrades.

In Working Example 3, Sample 4 described below having the amorphous magnetic layer 233b positioned on the magnetically pinned layer 230 was fabricated. In addition, Sample 5 to Sample 14 were fabricated for comparison. In Working Example 3, to verify the effect of placing the amorphous magnetic layer 233b on the magnetically pinned layer 230, the free magnetic layer 250 had the same structure as the conventional example.

The CoFeBTa amorphous magnetic layers in Sample 4 and Sample 9 to Sample 12 were identified to have a Ta composition of at least 3 at. % from the results of XRD and VSM and to maintain an amorphous structure after the 280° C. thermal processing. In addition, Sample 14 had a portion of the second magnetically pinned layer 233 set to a CoFeTa amorphous magnetic layer compared to the CoFeTa amorphous magnetic layer.

Sample 4 included: Si/Ta (1 nm)/Ru (2 nm)/Mn75Ir25 (5 nm)/Co75Fe25 (2 nm)/Ru (0.8 nm)/Co90Fe10 (0.5 nm)/(Co40Fe40B20)$_{94}$Ta$_6$ (0.5 nm)/Co40Fe40B20 (0.5 nm)/Co90Fe10 (1.4 nm)/MgO (0.8 nm)/Co90Fe10 (0.9 nm)/Co40Fe40B20 (3 nm)/Ru (3 nm)/Ta (3 nm)/Ru (4 nm)

A sample (Sample 5) similar to Sample 4 was fabricated except the film thickness of the CoFeB magnetic layer 233a (Co40Fe40B20 (0.5 nm)) was set to 1.0 nm.

A sample (Sample 6) similar to Sample 4 was fabricated except the film thickness of the CoFeB magnetic layer 233a (Co40Fe40B20 (0.5 nm)) was set to 1.5 nm.

A sample (Sample 7) similar to Sample 4 was fabricated except the film thickness of the amorphous magnetic layer 233b ((Co40Fe40B20)$_{94}$Ta$_6$) was set to 1.0 nm.

A sample (Sample 8) similar to Sample 4 was fabricated except the film thickness of the amorphous magnetic layer 233b ((Co40Fe40B20)$_{94}$Ta$_6$) was set to 1.5 nm.

A sample (Sample 9) similar to Sample 4 was fabricated except the amorphous magnetic layer 233b was (Co40Fe40B20)$_{97}$Ta$_3$.

A sample (Sample 10) similar to Sample 4 was fabricated except the amorphous magnetic layer 233b was (Co40Fe40B20)$_{90}$Ta$_{10}$.

A sample (Sample 11) similar to Sample 4 was fabricated except the amorphous magnetic layer 233b was (Co40Fe40B20)$_{87}$Ta$_{13}$.

A sample (Sample 12) similar to Sample 4 was fabricated except the amorphous magnetic layer 233b was (Co40Fe40B20)$_{83}$Ta$_{17}$.

A sample (Sample 13) similar to Sample 4 was fabricated except the structure had the CoFeB magnetic layer 233a (Co40Fe40B20 (0.5 nm)) removed from the second magnetically pinned layer 233.

A sample (Sample 14) similar to Sample 4 was fabricated except the amorphous magnetic layer 233b was $(Co40Fe40)_{85}Ta_{15}$.

Table 3 shows the results when the value of the TMR ratio was measured for each sample when the RA value was fixed. The measurement method was the CIPT method.

TABLE 3

| Sample No. | CoFeBTa film thickness | CoFeB film thickness | Film thickness of 2nd magnetically pinned layer | Ta composition | TMR ratio |
|---|---|---|---|---|---|
| 1 | — | 2.0 nm | 3.9 nm | — | 80.5% |
| 4 | 0.5 nm | 0.5 nm | 2.9 nm | 6 at. % | 90.3% |
| 5 | 0.5 nm | 1.0 nm | 3.4 nm | 6 at. % | 86.2% |
| 6 | 0.5 nm | 1.5 nm | 3.9 nm | 6 at. % | 87.3% |
| 7 | 1.0 nm | 0.5 nm | 3.4 nm | 6 at. % | 101.0% |
| 8 | 1.5 nm | 0.5 nm | 3.9 nm | 6 at. % | 103.9% |
| 9 | 0.5 nm | 0.5 nm | 2.9 nm | 3 at. % | 83.7% |
| 10 | 0.5 nm | 0.5 nm | 2.9 nm | 10 at. % | 85.4% |
| 11 | 0.5 nm | 0.5 nm | 2.9 nm | 13 at. % | 82.4% |
| 12 | 0.5 nm | 0.5 nm | 2.9 nm | 17 at. % | 65.6% |
| 13 | 0.5 nm | — | 2.4 nm | — | 20.3% |
| 14 | CoFeTa 0.5 nm | 0.5 nm | 2.9 nm | 15 at. % | 50.2% |

As shown in Table 3, from comparisons of Sample 1 of the conventional example and Samples 4 to 8 of the present working examples, it is clear that the degradation of the TMR ratio is suppressed even when the film thickness of the second magnetically pinned layer 230 is thinned by forming the second magnetically pinned layer 230 in a layered structure of CoFe magnetic layer 233c/CoFeB magnetic layer 233a/CoFeBTa amorphous magnetic layer 233b from the tunnel barrier layer 240 side.

From the comparisons of Sample 9 to Sample 12, a high TMR ratio is seen in the Ta composition range from 3 at. % to 13 at. %, particularly, from 3 at. % to 10 at. %.

As shown in Table 1, in the composition range for the Ta composition from 3 at. % to 10 at. %, the CoFeBTa amorphous magnetic layer exhibits a high saturated magnetization from approximately 0.75 T to 1.3 T. The magnetic coupling between the CoFeBTa amorphous magnetic layer 233b and the CoFe magnetic layer 233c is believed to be strong.

Consequently, it is believed that the magnetic layers of the layered structure of the CoFeBTa amorphous magnetic layer 233b and the CoFe magnetic layer 233c function well as one magnetic body; and the direction of magnetization of each layer acts independently, and the function as a magnetoresistive effect element is not damaged.

From the comparison of Sample 4 and Sample 13, the tunnel magnetoresistive effect film which has a second magnetically pinned layer 233 composed of only the CoFe magnetic layer 233c and the CoFeBTa amorphous magnetic layer 233b is known to have a large decrease in the TMR ratio. Thus, the effects of the present invention may be expected when the layered structure is a crystal layer, which is composed of CoFe magnetic layer 233c or CoFeB magnetic layer 233a, and an amorphous magnetic layer 233b. Consequently, the film structures disclosed in Japanese Unexamined Patent Appl. Pub. No. 2001-068760, Japanese Unexamined Patent Appl. Pub. No. 2004-071714, Japanese Unexamined Patent Appl. Pub. No. 2006-134950, Japanese Unexamined Patent Appl. Pub. No. 2008-198792, Japanese Unexamined Patent Appl. Pub. No. 2008-227388, Japanese Unexamined Patent Appl. Pub. No. 2009-004784 are not layered structures and are not believed to obtain the effects of the present invention.

From the comparison of Sample 4 and Sample 14, the CoFeTa amorphous magnetic layer, which does not contain the element B, has a large decrease in the TMR ratio. The reasons that the effects of the present invention are not obtained in the amorphous magnetic layer which does not contain the element B, namely, the reason that the effects of the present invention are obtained in the amorphous magnetic layer which contains the element B are as follows.

The epitaxial relationship from other than the tunnel barrier layer 240 is interrupted by the amorphous structure, and a portion of the B atoms diffused by the thermal processing is believed to contribute to the crystallization of the CoFeB magnetic layer 233a and the CoFe magnetic layer 233c. Thus, the amorphous magnetic layer 233b containing B is believed to obtain superior magnetization characteristics to those of the amorphous magnetic layer not containing B.

In Working Example 3, samples were fabricated with the film thickness of the amorphous magnetic layer 233b in the range of 0.5 nm to 1.5 nm. If the film thickness is approximately 0.25 nm, it is assumed that effects similar to those of Working Example 3 are exhibited.

In Working Example 3, Co40Fe40B20 was adopted as the structure of the CoFeB magnetic layer 233a. It is assumed that the same effects as Working Example 3 are exhibited if within the composition range represented by $(CoFe)_{100-x}B_x$ ($10 \leq x \leq 30$ at. %).

In Working Example 4, Samples 15, 16 which have an amorphous magnetic layer 250b placed in the free magnetic layer 250 were fabricated. The magnetically pinned layer 230 had the same structure as the conventional example. Table 4 shows the results when the value of the TMR ratio was measured for each sample when the RA value was fixed. The measurement method used the CIPT method.

TABLE 4

| Sample No. | CoFeB film thickness | CoFeBTa film thickness | Film thickness of free magnetic layer | Ta composition | TMR ratio |
|---|---|---|---|---|---|
| 1 | 3.0 nm | — | 3.9 | — | 80.5% |
| 15 | 2.0 nm | 0.5 nm | 3.4 | 6 at. % | 90.3% |
| 16 | 1.0 nm | 1.0 nm | 2.9 | 6 at. % | 86.2% |

As shown in Table 4, from the comparisons of Sample 1 in the conventional example and the Samples 15 and 16 in this working example, because the free magnetic layer 250 has the layered structure of CoFeB magnetic layer 250a/CoFeBTa amorphous magnetic layer 250b in order from the tunnel barrier layer 240 side, even if the film thickness of the free magnetic layer 250 is thinner, the degradation of the TMR ratio may be suppressed.

In Working Example 4, samples were fabricated with a film thickness of the amorphous magnetic layer 250b in the range of 0.5 nm to 1.0 nm. However, if the film thickness is approximately 0.25 nm to 1.5 nm, the effects equivalent to those of Working Example 4 are assumed.

In Working Example 4, the Co40Fe40B20 was adopted similar to Working Example 3 as the structure of the CoFeB layer 250a. However, it is assumed that effects equivalent to those of Working Example 4 are exhibited if within the composition range represented by $(CoFe)_{100-x}B_x$ ($10 \leq x \leq 30$ at. %).

In Working Example 4, 6 at. % was adopted as the Ta composition ratio of the CoFeBTa amorphous magnetic layer 250b. However, it is assumed that effects equivalent to those of Working Example 4 are exhibited if within the range from 3 to 13 at. % as in Working Example 3.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A magnetoresistive effect head, comprising:
a magnetically pinned layer having a direction of magnetization that is pinned;
a free magnetic layer positioned above the magnetically pinned layer, the free magnetic layer having a direction of magnetization that is free to vary; and
a tunnel barrier layer comprising an insulator positioned between the magnetically pinned layer and the free magnetic layer;
wherein at least one of the magnetically pinned layer and the free magnetic layer has a layered structure, the layered structure comprising:
a crystal layer comprising a CoFeB magnetic layer; and
an amorphous magnetic layer comprising CoFeB and an element selected from a group consisting of: Ta, Hf, Zr, and Nb,
wherein the crystal layer is positioned closer to the tunnel barrier layer than the amorphous magnetic layer,
wherein the magnetically pinned layer has the layered structure.

2. A magnetic data storage system, comprising:
at least one magnetoresistive effect head as recited in claim 1;
a magnetic medium;
a drive mechanism for passing the magnetic medium over the at least one magnetoresistive effect head; and
a controller electrically coupled to the at least one magnetoresistive effect head for controlling operation of the at least one magnetoresistive effect head.

3. The magnetoresistive effect head as recited in claim 1, wherein the free magnetic layer has the layered structure.

4. The magnetoresistive effect head as recited in claim 3, wherein a film thickness of the amorphous magnetic layer is in a range from about 0.25 nm to about 1.5 nm.

5. The magnetoresistive effect head as recited in claim 3, wherein the crystal layer comprises the CoFeB magnetic layer, wherein the CoFeB magnetic layer has a composition represented by $(CoFe)_{100-x}B_x$, with 10 at. % $\leq$ x $\leq$ 30 at. %.

6. A magnetic data storage system, comprising:
at least one magnetoresistive effect head as recited in claim 5;
a magnetic medium;
a drive mechanism for passing the magnetic medium over the at least one magnetoresistive effect head; and
a controller electrically coupled to the at least one magnetoresistive effect head for controlling operation of the at least one magnetoresistive effect head.

7. The magnetoresistive effect head as recited in claim 1, wherein the magnetically pinned layer and the free magnetic layer have the layered structure.

8. A magnetoresistive effect head, comprising:
a magnetically pinned layer having a direction of magnetization that is pinned;
a free magnetic layer positioned above the magnetically pinned layer, the free magnetic layer having a direction of magnetization that is free to vary; and
a tunnel barrier layer comprising an insulator positioned between the magnetically pinned layer and the free magnetic layer;
wherein the magnetically pinned layer has a layered structure, the layered structure comprising:
a crystal layer comprising one of: a CoFe magnetic layer or a CoFeB magnetic layer; and
an amorphous magnetic layer comprising CoFeB and an element selected from a group consisting of: Ta, Hf, Zr, and Nb,
wherein the crystal layer is positioned closer to the tunnel barrier layer than the amorphous magnetic layer.

9. The magnetoresistive effect head as recited in claim 8, wherein a film thickness of the amorphous magnetic layer is in a range from about 0.25 nm to about 1.5 nm.

10. The magnetoresistive effect head as recited in claim 8, wherein the crystal layer comprises the CoFeB magnetic layer, and wherein the CoFeB magnetic layer has a composition represented by $(CoFe)_{100-x}B_x$, with 10 at. % $\leq$ x $\leq$ 30 at. %.

11. A magnetic data storage system, comprising:
at least one magnetoresistive effect head as recited in claim 10;
a magnetic medium;
a drive mechanism for passing the magnetic medium over the at least one magnetoresistive effect head; and
a controller electrically coupled to the at least one magnetoresistive effect head for controlling operation of the at least one magnetoresistive effect head.

12. The magnetoresistive effect head as recited in claim 8, wherein the amorphous magnetic layer has a composition represented by $(CoFe)_{100-x}B_{x\ y}$, wherein is the element selected from the group consisting of: Ta, Hf, Zr, Nb, with 10 at. % $\leq$ x $\leq$ 30 at. %, and with 3 at. % $\leq$ y $\leq$ 13 at. %.

13. A magnetic data storage system, comprising:
at least one magnetoresistive effect head as recited in claim 12;
a magnetic medium;
a drive mechanism for passing the magnetic medium over the at least one magnetoresistive effect head; and
a controller electrically coupled to the at least one magnetoresistive effect head for controlling operation of the at least one magnetoresistive effect head.

14. The magnetoresistive effect head as recited in claim 8, wherein the free magnetic layer also has the layered structure.

15. The magnetoresistive effect head as recited in claim 14, wherein a film thickness of the amorphous magnetic layer in the pinned layer and the free magnetic layer is in a range from about 0.25 nm to about 1.5 nm.

16. The magnetoresistive effect head as recited in claim 14, wherein the crystal layer in the pinned layer and the free magnetic layer comprises the CoFeB magnetic layer, wherein the CoFeB magnetic layer has a composition represented by $(CoFe)_{100-x}B_x$, with 10 at. % $\leq$ x $\leq$ 30 at. %.

17. A magnetic data storage system, comprising:
at least one magnetoresistive effect head as recited in claim 8;
a magnetic medium;
a drive mechanism for passing the magnetic medium over the at least one magnetoresistive effect head; and
a controller electrically coupled to the at least one magnetoresistive effect head for controlling operation of the at least one magnetoresistive effect head.

18. A magnetoresistive effect head, comprising:
a magnetically pinned layer having a direction of magnetization that is pinned;

a free magnetic layer positioned above the magnetically pinned layer, the free magnetic layer having a direction of magnetization that is free to vary; and a tunnel barrier layer comprising an insulator positioned between the magnetically pinned layer and the free magnetic layer;

wherein the free magnetic layer has a layered structure, the layered structure comprising:

a crystal layer comprising one of: a CoFe magnetic layer or a CoFeB magnetic layer; and an amorphous magnetic layer comprising CoFeB and an element selected from a group consisting of: Ta, Hf, Zr, and Nb, wherein the crystal layer is positioned closer to the tunnel barrier layer than the amorphous magnetic layer, wherein the amorphous magnetic layer has a composition represented by $(CoFe)_{100-x}B_{x\ y}$, wherein is the element selected from the group consisting of: Ta, Hf, Zr, Nb, with 10 at. % $\leq x \leq$ 30 at. %, and with 3 at. % $\leq y \leq$ 13 at. %.

19. A magnetic data storage system, comprising:

at least one magnetoresistive effect head as recited in claim 18;

a magnetic medium;

a drive mechanism for passing the magnetic medium over the at least one magnetoresistive effect head; and a controller electrically coupled to the at least one magnetoresistive effect head for controlling operation of the at least one magnetoresistive effect head.

* * * * *

UNITED STATES PATENT AND TRADEMARK OFFICE
CERTIFICATE OF CORRECTION

PATENT NO.         : 8,514,527 B2
APPLICATION NO.    : 12/955767
DATED              : August 20, 2013
INVENTOR(S)        : Komagaki et al.

It is certified that error appears in the above-identified patent and that said Letters Patent is hereby corrected as shown below:

On the Title Page:

Item (56) in the listed publications (page 2):

replace prior art listing "JP    2008-277388    9/2008" with --JP    2008-227388    9/2008--.

In the Specification:

col. 4, lines 66-67 replace "anti ferromagnetic" with --antiferromagnetic--;

col. 4, lines 67 replace "in," with --in--.

Signed and Sealed this
Eighth Day of October, 2013

Teresa Stanek Rea
*Deputy Director of the United States Patent and Trademark Office*